United States Patent [19]
Lyons et al.

[11] Patent Number: 5,970,362
[45] Date of Patent: Oct. 19, 1999

[54] SIMPLIFIED SHALLOW TRENCH ISOLATION FORMATION WITH NO POLISH STOP

[75] Inventors: Christopher F. Lyons, Fremont, Calif.; Basab Bandyopadhyay, Austin, Tex.; Nick Kepler, Saratoga, Calif.; Olov Karlsson; Larry Wang, both of San Jose, Calif.; Effiong Ibok, Sunnyvale, Calif.

[73] Assignee: Advanced Micro Devices, Inc., Sunnyvale, Calif.

[21] Appl. No.: 08/992,488

[22] Filed: Dec. 18, 1997

[51] Int. Cl.$^6$ .................................................. H01L 21/76
[52] U.S. Cl. ............................................................ 438/424
[58] Field of Search ...................................... 438/424, 425, 438/426, 437, 404, 359, 295, 296, 117

[56] References Cited

U.S. PATENT DOCUMENTS

| | | | |
|---|---|---|---|
| 5,578,518 | 11/1996 | Koike et al. | 438/424 |
| 5,731,241 | 3/1998 | Jang et al. | 438/427 |
| 5,770,504 | 6/1998 | Brown et al. | 438/433 |
| 5,843,226 | 12/1998 | Zhao et al. | 117/97 |

*Primary Examiner*—Olik Chaudhuri
*Assistant Examiner*—Anh Duy Mai

[57] ABSTRACT

An insulated trench isolation structure is formed in a semiconductor substrate omitting a barrier nitride polish stop layer, thereby simplifying the formation of the trench isolating structure, and enabling the substrate to be polished substantially flush with the trench fill. The planar trench fill-substrate interface avoids additional topography, thereby facilitating application of, and enhancing the accuracy of, photolithographic techniques in forming features with minimal dimensions.

14 Claims, 4 Drawing Sheets

SIMPLIFIED SHALLOW TRENCH ISOLATION FORMATION WITH NO POLISH STOP

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions. in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material (or "trench fill"), such as silicon dioxide derived from tetraethyl orthosilicate (TEOS). The surface is then planarized, as by chemical-mechanical polishing (CMP) using the barrier nitride layer as a polish stop, and the nitride and pad oxide are stripped off the active areas to complete the trench isolation structure.

When creating the STI structure, it is considered desirable for the uppermost surface of the substrate to be flush (i.e., coplanar) with the uppermost surface of the trench fill, in order to maximize the performance of the finished device, and to provide a flat topography for subsequent processing steps, particularly photolithographic processing, thereby facilitating the formation of small features with accuracy and increased manufacturing throughput. However, planarity is adversely affected by conventional techniques, primarily due to the application of the barrier nitride layer as a polish stop.

Referring to FIGS. 1A–1C, which illustrate the substrate 1, pad oxide layer 2, barrier nitride layer 3, oxide liner 4 and insulating material 5, after the insulating material 5 has been applied (FIG. 1A), and planarized using the barrier nitride layer 3 as a polish stop (FIG. 1B), the barrier nitride layer 3 and pad oxide layer 2 are stripped off (FIG. 1C), creating a step having a height S between the main surface 1a of the substrate 1 and the uppermost surface 5a of the insulating material 5. Thus, the use of a conventional barrier nitride layer 3 as a polish stop creates a topographical step preventing planarity at the interface of the surface 1a and the surface 5a. Such a topographical step renders it difficult to photolithographically process subsequent layers of the device, particularly in forming features with fine dimensions, thereby adversely affecting process yield and production cost. This problem becomes more acute as circuit geometry is continuously reduced.

There exists a need for a semiconductor device and a method of manufacturing a semiconductor device wherein the uppermost surface of the substrate or epitaxial layer is substantially flush (i.e., coplanar) with the uppermost surface of the trench. thereby facilitating the formation of subsequent layers of the semiconductor device and enabling photolithographic processing of fine features. There also exists a continuing need for simplified shallow trench isolation methodology with fewer processing steps, thereby increasing manufacturing throughput.

SUMMARY OF THE INVENTION

An object of the present invention is a method of manufacturing a semiconductor device having an insulated trench formed in a semiconductor substrate with improved flatness of the uppermost trench/substrate interface, thereby facilitating formation of subsequent layers, and enabling photolithographic processing of fine features for high densification.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; providing a mask on the pad oxide layer, the mask containing a pattern having an opening with a dimension substantially equal to a dimension of the trench; etching to remove portions of the pad oxide layer and to form the trench having an internal surface; removing the mask; forming an oxide liner on the internal surface of the trench; depositing an insulating material to fill the trench and cover the pad oxide layer; and polishing the insulating material such that the main surface is exposed and an uppermost surface of the insulating material is substantially coplanar with the main surface.

Another aspect of the present invention is a method of manufacturing an integrated circuit on a semiconductor substrate, comprising: forming a silicon oxide pad layer on a main surface of the substrate or an epitaxial layer formed on the substrate; providing a photoresist mask on the pad oxide layer, the mask containing a pattern having an opening with a width substantially equal to a width of said trench of about 0.25μ or less; etching to remove portions of the underlying pad oxide layer and to form the trench, at a depth of about 2500 Å to about 4000 Å, the trench having) an internal surface; removing the mask; thermally growing a thin silicon oxide liner on the internal surface of the trench by heating to a temperature of about 1000° C. or higher; depositing an insulating material to fill the trench and cover the pad oxide layer, the instilating material comprising silicon dioxide derived from tetraethyl orthosilicate (TEOS) by low pressure chemical vapor deposition (LPCVD), silicon dioxide derived from silane by LPCVD, or a high density plasma oxide; and chemical-mechanical polishing such that the main surface is exposed and an uppermost surtface of the insulating material is substantially coplanar with the main surface.

A still further aspect of the present invention is a semiconductor device having, an active region isolated by an insulating trench, which trench comprises an opening formed in a semiconductor substrate or in an epitaxial layer formed in the substrate, a thermally grown oxide liner on a surface laver of the trench; and an insulating material filling the trench; wherein an uppermost surface of the insulating material is substantially coplanar with an uppermost surface of the substrate or epitaxial layer.

The liner and the insulating material may be silicon dioxide. The trench opening may have a width of about 0.25μ or less, and extend to a depth of about 2500 Å to about 4000 Å.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from topographical steps generated upon forming isolation trenches in accordance with conventional practices. Such isolation trenches adversely impact planarity and, hence, severely limit the capability of conventional photolithographic techniques in forming features with fine dimensions, e.g., less than about 0.25μ, particularly less than about 0.18μ. The present invention enables the manufacture of a semiconductor device without such undesirable topographical steps at the substrate/trench interface, and simultaneously simplifies the STI formation process by omitting formation of the conventional barrier nitride layer.

According to the methodology of the present invention, a photoresist mask is formed directly on a pad oxide laver which, in turn, is formed on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

Thus, the inventive methodology omits deposition of a barrier nitride layer between the pad oxide layer and the mask as in conventional methodology. Tile substrate is then etched to form a trench, and the mask removed. An oxide liner is then grown on the trench surface, and the trench filled with an insulating material. The insulating material is then planarized, as by CMP, down to the main surface such that the main surface and the uppermost surface of the insulating material are substantially coplanar, without the undesirable formation of a topographical step.

The omission of the barrier nitride layer does not have any adverse consequences on the resulting semiconductor device and manufacturing process. The conventionally formed nitride layer is primarily employed as a polish stop in the formation of STI structures. However, in accordance with the present invention, any damage attendant upon the lack of a nitride polish stop and consequential polishing of the main surface is easily repaired, as by reoxidation and/or etching. The advantages gained from increased planarity, improved photolithography, and omitting the nitride deposition greatly outweigh the additional repair processing steps in the event of overpolishing.

The omission of barrier nitride layer formation as a polish stop simplifies STI methodology, with a corresponding reduction in manufacturing cost. Furthermore, omission of the barrier nitride layer enables planarization of the insulating material down to the main surface, thereby eliminating the topographical step attendant upon conventional methods. Thus, no additional topography (i.e., step) is created, the flatness of the uppermost surface of the device is greatly improved, and subsequent layers are applied with increased facility and accuracy, thereby allowing a smaller circuit geometry with increased manufacturing throughput.

Figure 1A:
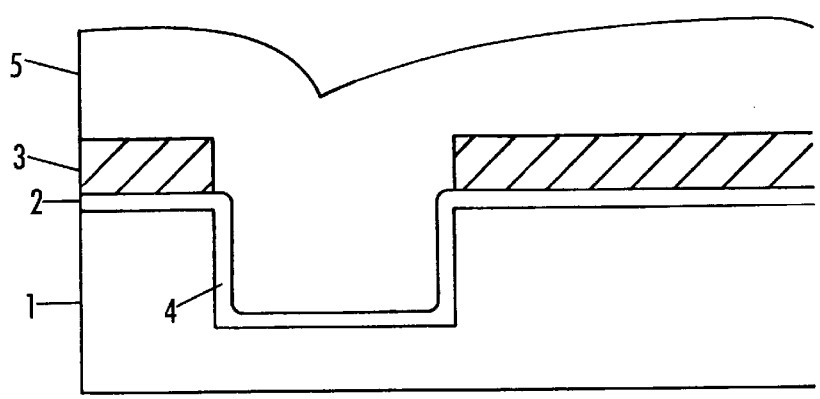
FIGS. 1A–1C schematically illustrate sequential phases of a conventional method of STI formation.
Figure 1B:
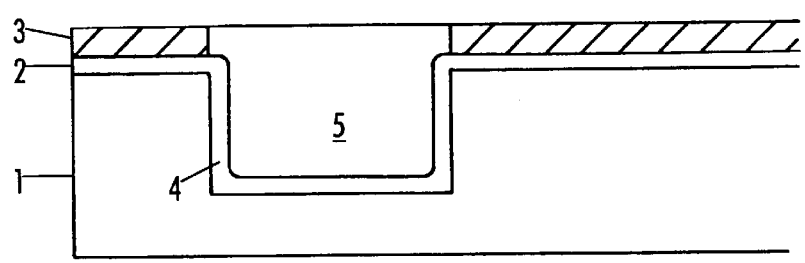
Figure 1C:
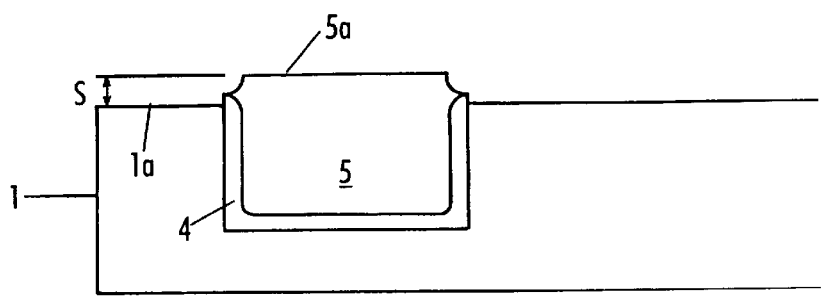
Figure 2A:
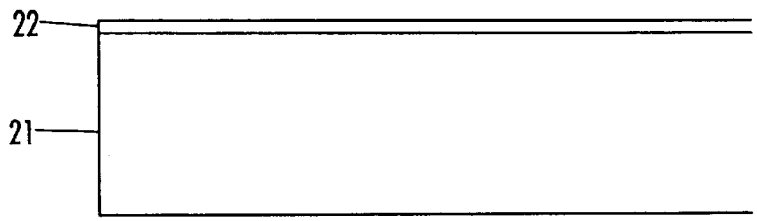
FIGS. 2A–2H schematically illustrate sequential phases of a method in accordance with an embodiment of the present invention.

An embodiment of the present invention is illustrated in FIGS. 2A–2H. wherein sequential phases in forming a semiconductor device in accordance with the present invention are depicted. Referring to FIG. 2A, substrate 21 is prepared having a substantially planar surface, typically a semiconductor substrate comprising doped monocrystalline silicon or an epitaxial layer formed on a semiconductor substrate in accordance with conventional practices. A pad oxide layer 22 is then grown on the substrate 21. Pad oxide layer 22 is typically silicon oxide and can be thermally grown on the substrate or deposited by chemical vapor deposition (CVD) to a thickness of about 100 Å to about 200 Å. In another embodiment, a pad oxide containing a thinned thermally-grown silicon oxide layer and a buffer polycrystalline silicon laver is employed as the pad layer. FIG. 2A illustrates silicon substrate 21 and the pad oxide layer 22.

Figure 2B:
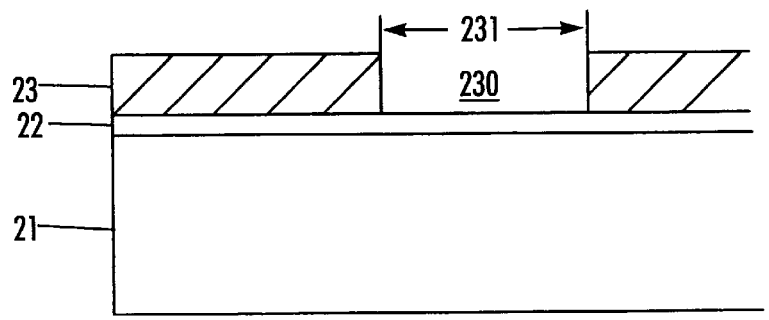
Figure 2C:
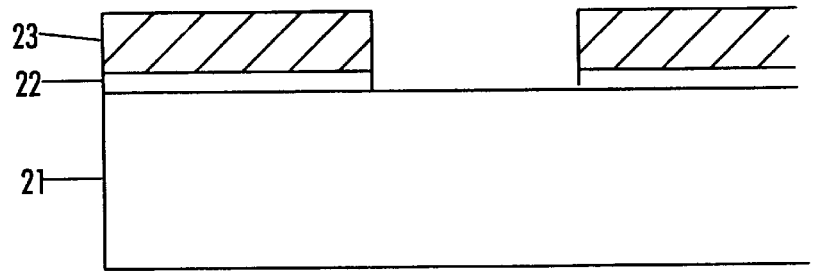
Figure 2D:
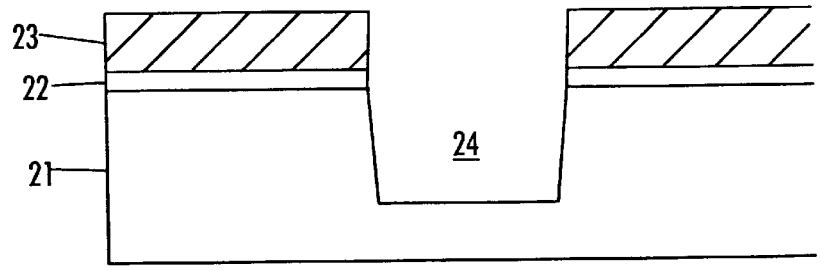

A photoresist mask 23 is then formed on pad oxide layer 22, as shown in FIG. 2B. Photoresist mask 23 has a pattern defined by openings 230, which have a width 231 substantially corresponding to the width of the subsequently formed trench, typically about 0.25μ or less. The pad oxide layer 2 is then etched away as shown in FIG. 2C. The etching continues into substrate 21 to form the shallow trench 24, as shown in FIG. 2D. The trench 24 is typically etched to a depth of about 2500 Å to about 4000 Å; e.g., about 3000 Å.

Figure 2E:
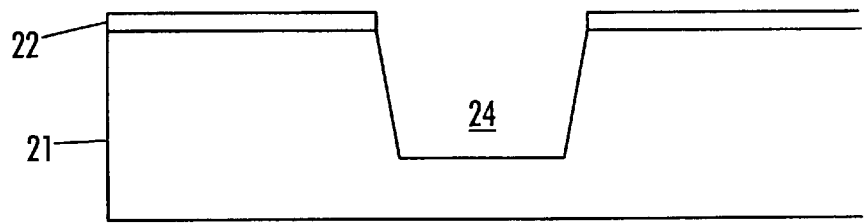
Figure 2F:
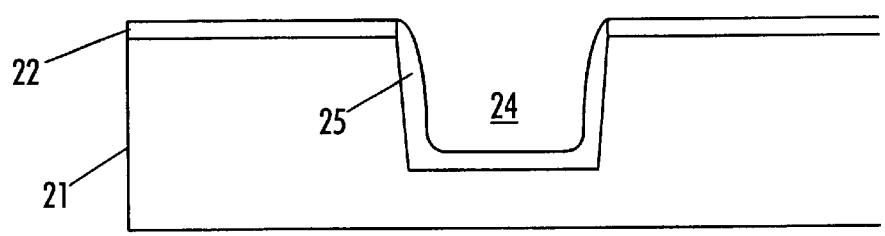

When the etching of the trench 24 is completed. the photoresist 23 is stripped off the pad oxide layer 22, resulting in the trench shown in FIG. 2E. Thereafter, the trench surface is thermally oxidized to form an oxide liner 25 on the inner surface of trench 24, typically at a temperature of about 1000° C. or higher. FIG. 2F shows the trench 24 with the completed liner 25.

Figure 2G:
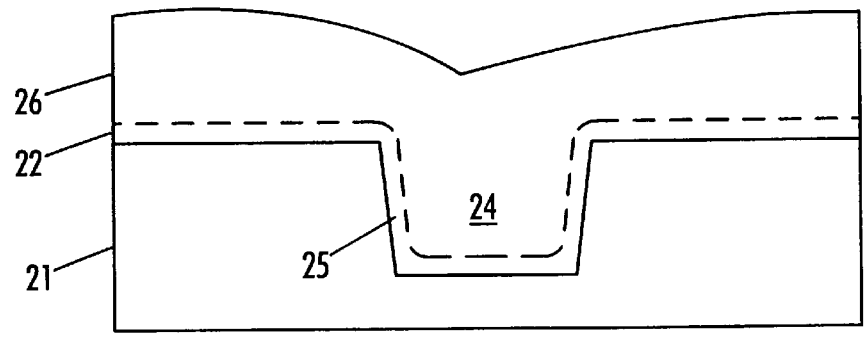
Figure 2H:
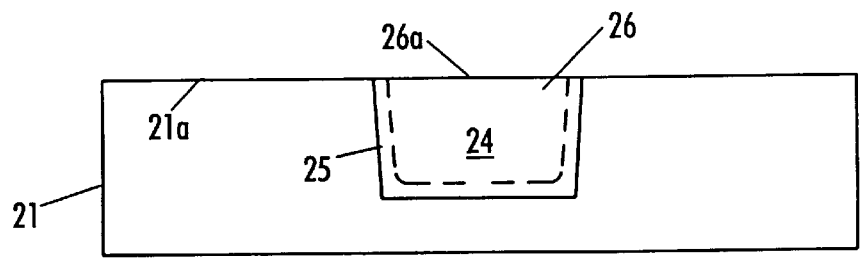

Subsequent to formation of the oxide liner 25, trench 24 is filled with a suitable insulating material 26, as shown in FIG. 2G. Such insulating material can comprise silicon dioxide derived from TEOS by LPCVD or derived from silane by LPCVD. The trench 24 can also be filled with a high density plasma (HDP) oxide, preferably employing the methodology disclosed in copending application Ser. No. 08/924,133. filed Sep. 5, 1997, the entire disclosure of which is hereby incorporated herein by reference. The interface between pad oxide layer 22 and oxide liner 25 is shown by a dotted line in FIG. 2G. Adverting to FIG. 2H, subsequent to trench filling, planarization is effected, as by CMP, to polish the insulating material 26 until the main surface 21a of substrate 21 and the uppermost surface 26a of the insulating material 26 are substantially coplanar. Polishing is stopped before the main surface 21a is damaged.

One having ordinary skill in the art can easily optimize the CMP process parameters (e.g., polishing time) depending on, inter alia, the thickness of the deposited insulating material. The CMP process can be controlled to avoid any substrate damage or any substantial substrate damage by well-known techniques based on the expected decrease in polishing rate when the silicon of the main surface 21a is reached. Such techniques include optical monitoring of the polish rate by external sensors, or monitoring of the friction between the polishing pad and the semiconductor device.

If the main surface 21a is damaged by the CMP process due to contact between the silicon and the polish, whether such damage is physical (scratching) or chemical (contamination of the silicon with other materials), the main surface 21a is repaired. For example, in an embodiment of the present invention, the main surface 21a is wet etched or plasma etched, thereby restoring fresh silicon at the main surface 21a. Alternatively, the main surface 21a may be reoxidized by heating at a temperature of about 1000° C. or higher to grow a thin silicon dioxide layer, and the grown silicon dioxide layer removed by wet etching or plasma etching to restore fresh silicon at the main surface 21a.

Figure 3:
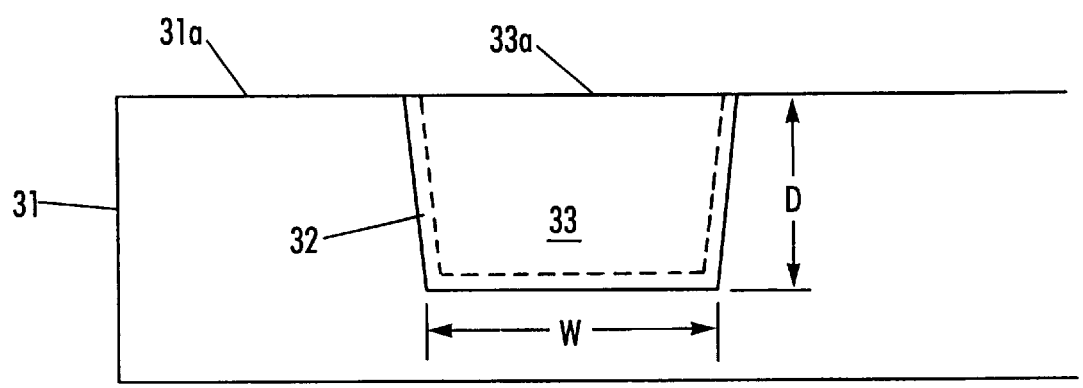
FIG. 3 is a cross-sectional view of a semiconductor device according to the present invention.

An embodiment of a semiconductor device in accordance with the present invention is described with reference to FIG. 3. the inventive semiconductor device comprises a trench formed in substrate 31, a thermally grown silicon dioxide liner 32 on a surface layer of the trench, and silicon dioxide insulating material 33 filling the trench. The uppermost surface 33a of the insulating material 33 is substantially coplanar with an uppermost surface 31a of the substrate 31. The trench typically has a width W of about 0.25$\mu$ or less, and a depth D of about 2500 Å to about 4000 Å; e.g,. about 3000 Å.

The trench isolation structure formed in accordance with the present invention enables formation of an STI structure without the use of a barrier nitride layer as a polish stop. thereby simplifying the STI formation process, and enabling the uppermost surface of the STI structure to be substantially coplanar with the main surface of the semiconductor substrate. The present invention avoids creation of a topography step as in conventional STI methodology, thereby significantly improving planarity. As a result, subsequent layers can be applied with greater facility and accuracy. Thereby enhancing photolithographic accuracy in the formation of fine features with increased manufacturing throughput. The present invention is applicable to the manufacture of various types of semiconductor devices having STI, particularly high density semiconductor devices having a design rule of about 0.25$\mu$ and under.

The present invention can be practiced by employing conventional materials, methodology and equipment. Accordingly. the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on said semiconductor substrate, which method comprises:

forming a pad oxide layer on a main surface of said substrate or epitaxial layer;

providing a photoresist mask directly on said pad oxide layer, said photoresist mask containing a pattern having an opening with a dimension substantially equal to a dimension of said trench;

etching to remove portions of said underlying pad oxide layer and to form said trench having an internal surface;

removing said photoresist mask;

forming an oxide liner on said internal surface of said trench;

depositing an insulating material directly on said pad oxide layer and to fill said trench;

polishing such that said main surface is exposed and an uppermost surface of said insulating material is substantially coplanar with said main surface; and etching said main surface by wet etching or plasma etching subsequent to polishing.

2. The method according to claim 1, wherein said pad oxide layer comprises silicon dioxide.

3. The method according to claim 1, wherein said opening in said mask has a width substantially equal to a width of said trench.

4. The method according to claim 3, wherein said width of said opening is about 0.25$\mu$ or under.

5. The method according to claim 4, wherein said trench is etched to a depth of about 2500 Å to about 4000 Å.

6. The method according to claim 5, wherein said trench is etched to a depth of about 3000 Å.

7. The method according to claim 2, comprising heating at a temperature of about 1000° C. or higher to thermally grow a silicon oxide liner.

8. The method according to claim 2, wherein said insulating material comprises silicon dioxide derived from tetraethyl orthosilicate (TEOS) by low pressure chemical vapor deposition (LPCVD), silicon dioxide derived from silane by LPCVD, or a high density plasma oxide.

9. The method according to claim 8, comprising polishing by chemical-mechanical polishing.

10. A method of manufacturing a semiconductor device having an insulated trench formed in a semiconductor substrate or in an epitaxial layer on said semiconductor substrate, which method comprises:

forming a pad oxide layer on a main surface of said substrate or epitaxial layer;

providing a photoresist mask directly on said pad oxide layer, said photoresist mask containing a pattern having an opening with a dimension substantially equal to a dimension of said trench;

etching to remove portions of said underlying pad oxide layer and to form said trench having an internal surface;

removing said photoresist mask;

forming an oxide liner on said internal surface of said trench;

depositing an insulating material directly on said pad oxide layer and to fill said trench;

polishing such that said main surface is exposed and an uppermost surface of said insulating material is substantially coplanar with said main surface;

forming an oxide repair layer on said main surface subsequent to polishing; and removing said repair layer by wet etching or plasma etching.

11. The method according to claim 10, comprising heating at a temperature of about 1000° C. or higher to thermally grow a silicon dioxide repair layer.

12. The product produced by the method of claim 1.

13. A method of manufacturing an integrated circuit on a semiconductor substrate, comprising:

forming a silicon oxide pad layer on a main surface of said substrate or an epitaxial layer formed on said substrate;

providing a photoresist mask directly on said pad oxide layer, said mask containing a pattern having an opening with a width substantially equal to a width of said trench of about 0.25μ or less;

etching to remove portions of said underlying pad oxide layer and to form said trench, at a depth of about 2500 Å to about 4000 Å, said trench having an internal surface;

removing said mask;

thermally growing a thin silicon oxide liner on said internal surface of said trench by heating to a temperature of about 1000° C. or higher;

depositing an insulating material directly on said pad oxide layer and to fill said trench, said insulating material comprising silicon dioxide derived from tetraethyl orthosilicate (TEOS) by low pressure chemical vapor deposition (LPCVD), silicon dioxide derived from silane by LPCVD, or a high density plasma oxide;

chemical-mechanical polishing such that said main surface is exposed and an uppermost surface of said insulating material is substantially coplanar with said main surface; and etching said main surface by wet etching or plasma etching subsequent to chemical-mechanical polishing.

14. The product produced by the method of claim 13.

* * * * *

UNITED STATES PATENT AND TRADEMARK OFFICE
CERTIFICATE OF CORRECTION

PATENT NO. : 5,970,362
DATED : Oct. 19, 1999
INVENTOR(S) : Lyons et al.

It is certified that error appears in the above-identified patent and that said Letters Patent is hereby corrected as shown below:

In the Claims, in the Claim 10, line 3, "cpitaxial laver: should read -- epitaxial layer--.

Signed and Sealed this

Second Day of May, 2000

Attest:

Q. TODD DICKINSON

Attesting Officer

Director of Patents and Trademarks